(12) United States Patent
Zanetti et al.

(10) Patent No.: US 11,854,809 B2
(45) Date of Patent: Dec. 26, 2023

(54) MANUFACTURING METHOD OF A SEMICONDUCTOR DEVICE WITH EFFICIENT EDGE STRUCTURE

(71) Applicant: STMICROELECTRONICS S.r.l., Agrate Brianza (IT)

(72) Inventors: Edoardo Zanetti, Valverde (IT); Simone Rascuna', Catania (IT); Mario Giuseppe Saggio, Aci Bonaccorsi (IT); Alfio Guarnera, Trecastagni (IT); Leonardo Fragapane, Catania (IT); Cristina Tringali, Augusta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/061,795

(22) Filed: Dec. 5, 2022

(65) Prior Publication Data
US 2023/0099610 A1 Mar. 30, 2023

Related U.S. Application Data

(63) Continuation of application No. 17/244,393, filed on Apr. 29, 2021, now Pat. No. 11,545,362, which is a
(Continued)

(30) Foreign Application Priority Data

Dec. 5, 2017 (IT) .................... 102017000140373

(51) Int. Cl.
*H01L 21/04* (2006.01)
*H01L 21/285* (2006.01)
(Continued)

(52) U.S. Cl.
CPC ........ *H01L 21/046* (2013.01); *H01L 21/0495* (2013.01); *H01L 21/28537* (2013.01);
(Continued)

(58) Field of Classification Search
CPC ............... H01L 21/046; H01L 21/0495; H01L 21/28537
See application file for complete search history.

(56) References Cited

U.S. PATENT DOCUMENTS

2002/0008281 A1  1/2002  Hshieh et al.
2008/0277669 A1  11/2008  Okuno et al.
(Continued)

FOREIGN PATENT DOCUMENTS

CN      1449573 A       10/2003
DE   202012000826 U1    6/2012

*Primary Examiner* — Errol V Fernandes
(74) *Attorney, Agent, or Firm* — SEED INTELLECTUAL PROPERTY LAW GROUP LLP (57) ABSTRACT

A manufacturing method of an electronic device includes: forming a drift layer of an N type; forming a trench in the drift layer; forming an edge-termination structure alongside the trench by implanting dopant species of a P type; and forming a depression region between the trench and the edge-termination structure by digging the drift layer. The steps of forming the depression region and the trench are carried out at the same time. The step of forming the depression region comprises patterning the drift layer to form a structural connection with the edge-termination structure having a first slope, and the step of forming the trench comprises etching the drift layer to define side walls of the trench, which have a second slope steeper than the first slope.

18 Claims, 5 Drawing Sheets

Related U.S. Application Data continuation of application No. 16/209,680, filed on Dec. 4, 2018, now Pat. No. 11,018,008.

(51) Int. Cl.
*H01L 29/872* (2006.01)
*H01L 29/66* (2006.01)
*H01L 29/16* (2006.01)
*H01L 29/78* (2006.01)
*H01L 29/06* (2006.01)

(52) U.S. Cl.
CPC ...... *H01L 29/0619* (2013.01); *H01L 29/0661* (2013.01); *H01L 29/1608* (2013.01); *H01L 29/6606* (2013.01); *H01L 29/66068* (2013.01); *H01L 29/66143* (2013.01); *H01L 29/66734* (2013.01); *H01L 29/7811* (2013.01); *H01L 29/7813* (2013.01); *H01L 29/872* (2013.01); *H01L 29/8725* (2013.01)

(56) References Cited

U.S. PATENT DOCUMENTS

| | | | |
|---|---|---|---|
| 2010/0078754 A1* | 4/2010 | Veliadis | H01L 29/0661 257/491 |
| 2010/0078755 A1 | 4/2010 | Veliadis et al. | |
| 2012/0292636 A1 | 11/2012 | Zhang et al. | |
| 2013/0320462 A1* | 12/2013 | Tipirneni | H01L 29/0615 257/E21.135 |
| 2015/0333190 A1 | 11/2015 | Aketa et al. | |
| 2016/0079244 A1 | 3/2016 | Veliadis | |
| 2016/0335384 A1 | 11/2016 | Song et al. | |
| 2017/0345889 A1 | 11/2017 | Konstantinov | |
| 2019/0172715 A1 | 6/2019 | Zanetti et al. | |

* cited by examiner

MANUFACTURING METHOD OF A SEMICONDUCTOR DEVICE WITH EFFICIENT EDGE STRUCTURE

BACKGROUND

Technical Field

The present disclosure relates to a manufacturing method of an electronic device, for example based upon silicon carbide, provided with an edge structure.

Description of the Related Art

As is known, semiconductor materials which have a wide forbidden band gap, in particular, an energy value Eg of the forbidden band gap greater than 1.1 eV, low on-state resistance ($R_{ON}$), high value of thermal conductivity, high operating frequency, and high velocity saturation of charge carriers, are ideal for producing electronic components, such as diodes or transistors, in particular for power applications. A material having said characteristics, and designed to be used manufacturing electronic components, is silicon carbide (SiC). In particular, silicon carbide, in its different polytypes (e.g., 3C—SiC, 4H—SiC, 6H—SiC), is preferable to silicon as regards the properties listed previously.

Electronic devices provided on a silicon carbide substrate, as compared to similar devices provided on a silicon substrate, present numerous advantageous characteristics, such as low output resistance in conduction, low leakage current, high working temperature, and high working frequencies.

Figure 1:
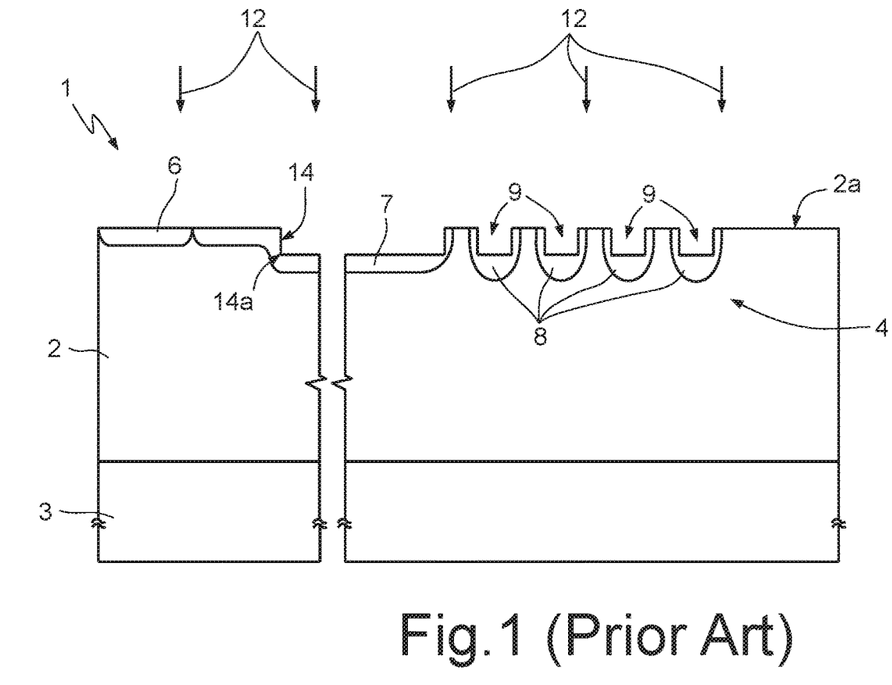
FIG. 1 shows a JBS (Junction-Barrier Schottky) diode according to an embodiment that does not form the subject of the present disclosure.

FIG. 1 shows, in lateral sectional view, a Schottky diode 1 during an intermediate manufacturing step, and comprises a drift layer 2 that extends over a substrate 3 and has a first conductivity type(N). An active region 4 extends at a top surface 2a of the drift layer 2. An edge termination region 6, in particular an implanted region having a second conductivity type(P) extends at the top surface 2a and surrounds, either completely or partially, the active area 4. Extending between the active area 4 and the edge termination region 6 is an edge transition region 7, which has a second conductivity type(P) and is designed to be contacted by a metal layer (not illustrated) that forms an anode contact. A cathode contact (not illustrated) may instead be formed in an area corresponding to the substrate 3.

A plurality of junction-barrier (JB) elements 8 extend on the top surface 2a, and each include a respective implanted region having the second type of conductivity. A respective recess 9 extends from the top surface 2a for each junction-barrier element 8, so that each recess 9 is completely surrounded by the respective junction-barrier element 8 and is not directly adjacent to portions of the drift layer 2 that have the first type of conductivity. Instead, regions of the drift layer 2 that have the first conductivity type extend between one junction-barrier element 8 and the adjacent junction-barrier element 8. Formed in manufacturing steps subsequent to that of FIG. 1 and not illustrated herein on the top surface 2a and within the recesses 9, in particular in direct contact with the drift layer 2 and with the junction-barrier elements 8, is a metal layer (anode metallization) that provides a Schottky (metal-semiconductor) junction with portions of the drift layer 2 that have the first conductivity type and a different barrier junction with the junction-barrier elements 8.

In use, when the Schottky diode 1 is forward-biased, the Schottky junction switches on before the barrier junction. For low forward voltages, the current drift is dominated by the majority carriers (here, electrons) injected through the Schottky junction, and the diode 1 operates in a traditional way. When the diode 1 is reverse-biased, depletion regions that are formed adjacent to the barrier junctions expand and block the reverse current, thus protecting the Schottky junction and limiting the reverse leakage current. The diode 1 operates, in this condition, as a PIN diode. The presence of the trenches 9 has the function of enabling formation of the junction-barrier elements 8 at a greater depth, in the layer 2, with respect to a condition where the trenches are not present (implantation to form the junction-barrier elements 8 is in fact carried out after etching of the trenches 9). This technical solution proves particularly beneficial for SiC devices, improving the aforementioned effects of protection of the Schottky junction and of limitation of the reverse leakage current. The step of formation of the trenches 9 envisages a chemical etching, for example a directional dry etching, represented schematically by arrows 12 in FIG. 1. By choosing an etching technique of an anisotropic type it is possible to provide trenches 9 with substantially vertical side walls. A compact device is thus obtained, in which the dimensions of the active area are limited only by the photolithographic technique used. However, this same type of etching causes formation of a step 14 with a steep transition (close to 90° with respect to the plane of lie XY of the top surface 2a) between the edge transition region 7 and the edge termination region 6. It is known that the presence of the bottom inside edge 14a concentrates, during use, the electrical field, causing triggering of the avalanche-multiplication process in a premature way (low reverse-biasing values).

Figure 2:
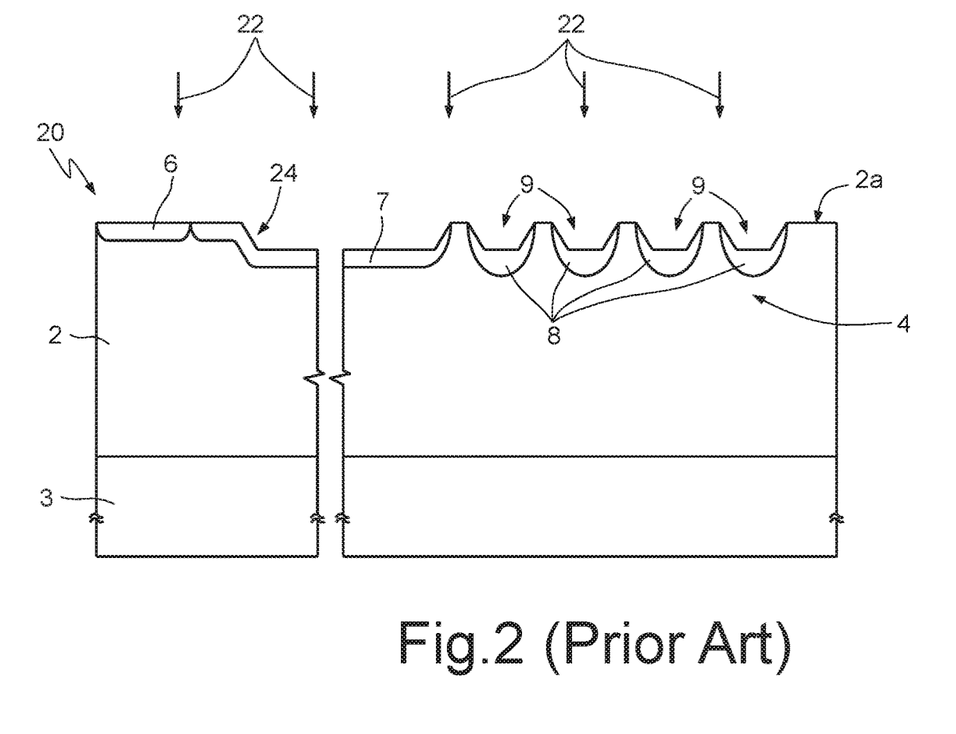
FIG. 2 shows a JBS diode according to a further embodiment that does not form the subject of the present disclosure.

To overcome the problems mentioned above, a solution known to the present applicant envisages formation of an edge transition region between the active area 4 and the edge termination region 6 having a surface 24 that is inclined (with respect to the plane of the surface 2a) and having a slope much lower than 90°, in particular lower than 50° (angle of elevation measured between the plane of the surface 2a and the inclined surface of the edge termination region 6, within the drift layer 2). This embodiment is illustrated in FIG. 2, which shows, in lateral sectional view, a Schottky diode 20 in an intermediate manufacturing step corresponding to that of FIG. 1. Elements of FIG. 2 that are functionally similar to corresponding elements of FIG. 1 are designated by the same reference numbers and are not described any further herein.

In what follows, the step of formation of the trenches 9 envisages a chemical etching, represented schematically by arrows 22, which contemplates the use of a process with a higher degree of isotropy. In this way, it is possible to provide a transition region having the inclined surface 24 between the active area 4 and the edge region 6 that presents the desired slope. Since during this etching step also the trenches 9 are formed, are these are delimited by side walls having the same slope as the inclined surface 24. Even though this characteristic does not adversely affect the electrical behavior in the active region 4, it causes, however, an undesirable increase in the area occupied by the active region 4.

A solution to the disadvantage of the embodiment of FIG. 2 consists in carrying out two different steps of masked chemical etching, one to form the trenches 9 with substantially vertical walls and the other to form the transition region with inclined surface 24 having the desired slope (e.g., less than 55°). Also this solution, however, presents disadvantages, due to the need to provide at least two different etching masks and carry out two different etching processes that consequently increase the costs and duration of the manufacturing process. Further, misalignments may occur with respect to the arrangement envisaged in the design stage, between the active region and the edge region, as a result of undesirable misalignments of the masks used during the aforementioned photolithographic processes. A possible misalignment may cause a loss of efficiency of the device in reverse-biasing conditions.

BRIEF SUMMARY

One or more embodiments of the present disclosure provide a manufacturing method of an electronic device, in particular a power diode with Schottky junction, that will not present the drawbacks of the prior art.

One or more embodiments of the present discloser are directed to a manufacturing method for making an electronic device and includes forming a drift layer having a top surface and a first conductivity; forming a trench in the drift layer by etching the drift layer starting from the top surface; forming an edge-termination structure laterally to said trench by implanting dopant species which have a second conductivity different from the first conductivity; and forming a depression region between said trench and said edge-termination structure by etching the drift layer starting from the top surface. In one or more embodiments, forming the depression region and forming the trench are carried out at the same time, forming the depression region comprises patterning the drift layer to have a first slope, and forming the trench comprises etching the drift layer to define side walls of the trench which have a second slope steeper than the first slope.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

According to the present disclosure, a method is provided for manufacturing an electronic device 50, in particular a diode, even more in particular a power diode with Schottky junction (JBS diode).

The manufacturing method is described with reference to FIGS. 3A-3H, which illustrate, in lateral sectional view, steps of processing of a wafer 100 of semiconductor material. FIGS. 3A-3H show the wafer 100 in a triaxial system of mutually orthogonal axes X, Y, Z.

Figure 3A:
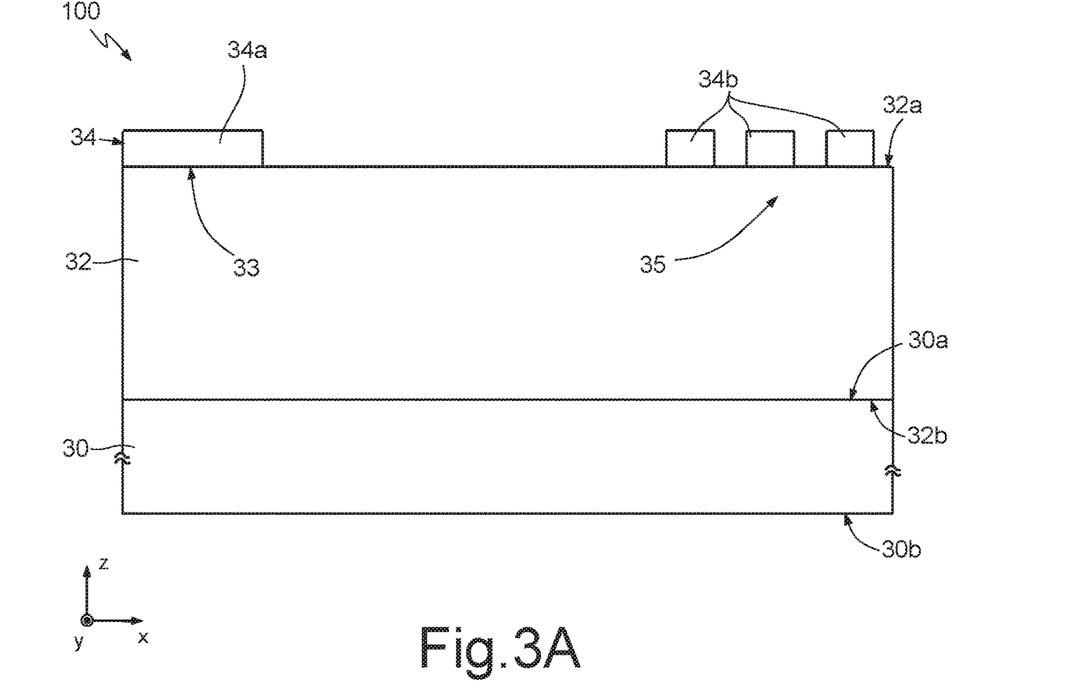
FIGS. 3A-3H show steps for manufacturing an electronic device, in particular a power diode, more in particular a JBS diode, according to the present disclosure.

With reference to FIG. 3A, the wafer 100 comprises a substrate 30 of semiconductor material, in particular silicon carbide (SiC) having a first conductivity type (in this embodiment a doping of an N type), provided with a front side 30a and a back side 30b that are opposite to one another.

The resistivity of the substrate 30 is, for example, comprised between 5 mΩ·cm and 40 mΩ·cm.

Formed on the front side 30a of the substrate 30, for example by epitaxial growth, is a drift layer 32, of silicon carbide having the first conductivity type(N) and having a concentration of dopants lower than that of the substrate 30, for example comprised between $1 \cdot 10^{14}$ and $5 \cdot 10^{16}$ atoms/cm$^3$. The drift layer 32 is made of SiC, in particular 4H—SiC, but other polytypes may be used, such as 2H, 6H, 3C, and/or 15R.

Alternatively, the substrate 30 and the drift layer 32 may be made of other semiconductor materials, for example GaN, GaAs, Si, Ge, or others still.

The drift layer 32 extends between a top side 32a and a bottom side 32b (the latter in direct contact with the front side 30a of the substrate 30). On the top side 32a of the drift layer 32 a hard mask 34 is formed, for example by deposition of a mask layer, made, for example, of tetraethyl orthosilicate (TEOS), and subsequent photolithographic definition. The hard mask 34 has a thickness of between 0.5 μm and 2 μm, or in any case a thickness such as to shield the implantation described hereinafter with reference to FIG. 3D. The hard mask 34 thus formed comprises: a first portion 34a, which extends in a region 33 of the wafer 100 where, in subsequent steps, an edge region of the diode 50 (of the same type as the edge region 6 of FIGS. 1 and 2) will be formed; and a plurality of second portions 34b, which extend in a region 35 of the wafer 100 where, in subsequent steps, the active area of the diode 50 will be formed.

Etching of the mask layer 34 is carried out, for example, via a dry-etching process—for example of a RIE (Reactive Ion-Etching) type, or else of an ICP (Inductively Coupled Plasma) type—with high anisotropic component, using an etching chemistry selective in regard to the drift layer 32. In this example, since the layer 32 is made of SiC, it is possible to use as etching chemistry CHF$_3$/CF$_4$/Ar diluted in He, with conditions of pressure in the etching chamber that range between 100 and 10 mTorr (according to whether it is a RIE or an ICP etching) and with a power of between 500 and 700 W. It is thus possible to obtain second portions 34b, which have side walls that are substantially orthogonal (between approximately 85° and 89°, e.g., approximately 88°) with respect to the plane of lie (parallel to XY) of the top side 32a of the drift layer 32.

The material of the mask layer, as likewise the etching chemistry, may be chosen as a function of the angle that it is desired to obtain between the side walls of the second portions 34b and the plane of lie of the top side 32a of the drift layer 32. Here, an angle close to 90° (or, in general, greater than 85°) is desirable in order to render the diode 50 compact in the direction of the axis X.

This is followed (FIG. 3B) by a step of formation of a further mask 36 on the wafer 100 and in particular on the first portion 34a of the hard mask 34 and on the drift layer 32 in a region of the latter that extends between the first portion 34a of the hard mask 34 and the second portions 34b (i.e., between the region 33 and the region 35).

Figure 3B:
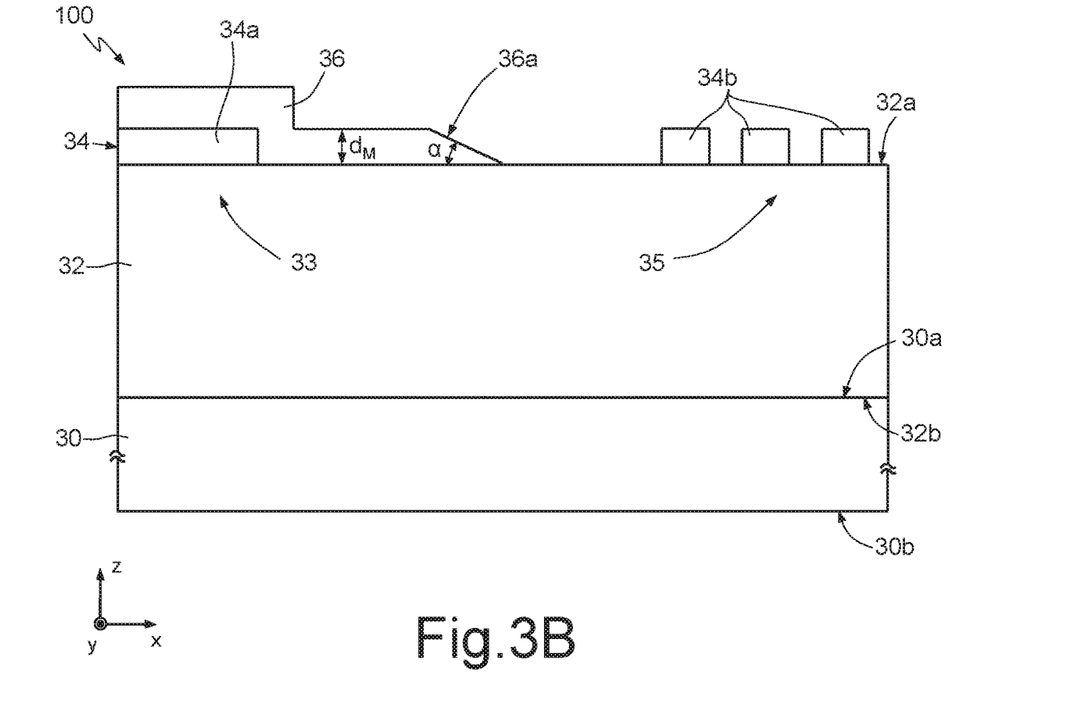

The mask 36 does not extend, instead, over or between the second portions 34b or, in any case, on the region 35 of the wafer 100 where the active area of the diode 50 will be formed.

As may be noted from FIG. 3B, the step of formation of the mask 36 envisages, after a step of deposition of a photoresist layer (e.g., by spinning), a step of removal of selective portions of the photoresist layer in order to form a transition zone 36a that has a surface inclined with respect to the top surface 32a; thus, in the transition zone 36a, the thickness of the mask 36, measured along the axis Z starting from the top surface 32a of the drift layer 32, decreases progressively in the direction away from the region 33 (or, likewise, in the direction towards the region 35). In particular, the mask 36 has a maximum thickness $d_M$, measured along the axis Z, comprised between 2 µm and 6 µm, and, in the transition zone 36a, the thickness of the mask 36 decreases from $d_M$ to a zero thickness with a pre-set slope. The inclined surface of the mask 36 has a slope set between 10° and 60°, for example 45° (amplitude of the internal angle α of the mask 36, formed by the intersection of the inclined surface with the top surface 32a of the drift layer 32).

In the embodiment of FIG. 3B, the reduction in thickness of the mask 36 in the transition zone 36a is substantially linear along the axis X; in a different embodiment (not illustrated), the reduction in thickness of the mask 36 is made in discrete steps along the axis X, i.e., through small steps.

The desired shape for the mask 36, in particular for the transition zone 36a, may be obtained with a process that uses photoresists of a large thickness (in particular, equal to or greater than 2 µm), an appropriate step of exposure to light where the conditions of focusing of the process may be altered with respect to the best setting (auto-focus) that the machine would automatically implement. The condition of defocusing is, in particular, comprised between 0 and −1.5 µm with respect to the plane of lie of the mask 36 (or rather, of the top side of the mask 36, in order to reduce the effect of its thickness), followed by a step of development in which a single dispensation of the solvent or a double dispensation of the solvent ("double puddle") may be carried out to remove the part of photoresist exposed to the UV radiation during the step of exposure to light. At the end of the development step, the transition zone 36a will present an angle of elevation (angle α in FIG. 3B) in the plane defined by the top side 32a that is comprised between approximately 70° and 75°. The mask 36 is then subjected to an appropriate thermal treatment to favor stabilization thereof; this step entails a further variation of the angle α, which drops to a value of between approximately 60° and 70°. The aforementioned thermal treatment of the mask 36 envisages, in an embodiment, a process of baking in an oven at a temperature comprised between 120° C. and 130° C. for 1 h, with or without an initial ramp; in a further embodiment, the thermal treatment envisages a process of a deep-UV type whereby baking is carried out at a temperature of between 200° C. and 220° C., reached by a temperature ramp of the duration of 3-5 minutes, in the presence of UV radiation. UV radiation facilitates and accelerates the process of cross-linking of the photoresist.

During the aforementioned step of thermal treatment of the photoresist, the photoresist releases the solvent trapped within it, and simultaneously the cross-linking process is carried out, with the modification of the double and triple bonds of the macromolecules that constitute it: the result of that modification at a macroscopic level is a greater resistance to plasmas (which is useful, especially in the subsequent step of etching of the SiC), as well as a variation of the profile of the photoresist layer itself. In this way, a profile (in cross-sectional view in the plane XZ) of the mask 36 is generated that forms with the plane of lie of the side 32a (parallel to XY) an angle of between 60° and 70°, as specified above.

There then follows a step (FIG. 3C) of etching of the wafer 100, in particular a dry etch using an ICP etching tool, using as etching chemistry $O_2/SF_6/HBr$, with a pressure in the region of approximately 10-15 mTorr and a power ranging between 600 W and 800 W at the source (for generation of the plasma) and a bias power of between 70 W and 150 W (for acceleration of the etching species towards the chuck). The aforementioned parameters are, in general, chosen so as to remove the mask 36 at a rate higher (e.g., approximately three times higher) than the rate of removal of the drift layer 32.

Figure 3C:
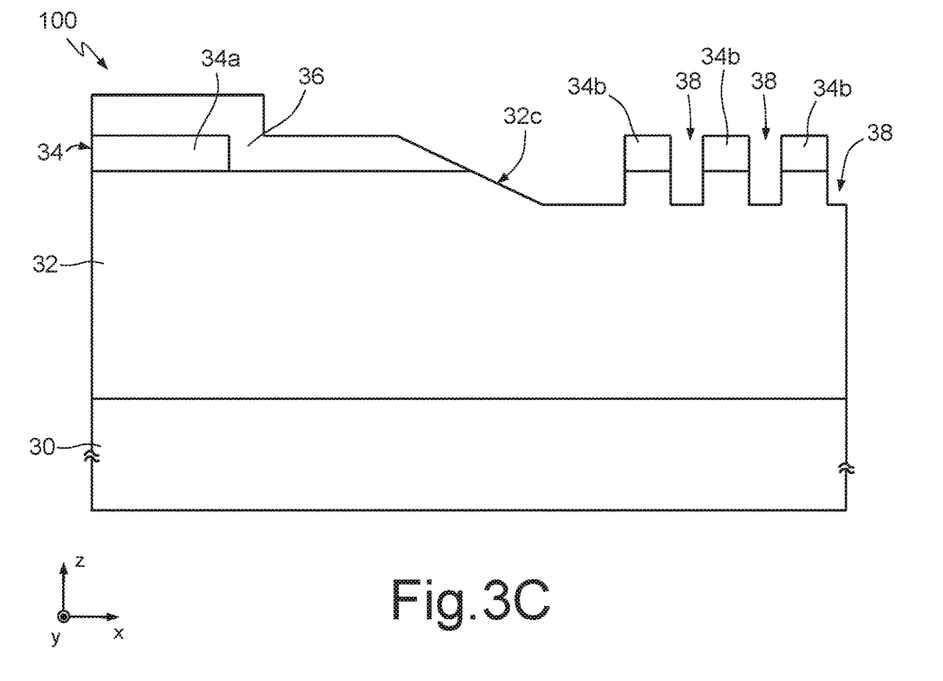

Etching proceeds, removing portions of the drift layer 32 not protected by the mask 36 or the mask 34, to form trenches 38, which have substantially vertical walls, in the drift layer 32 in the region 35 (active area of the diode 50).

Since the aforementioned etching process likewise removes surface portions of the mask 36, by carrying out the etching step of FIG. 3C for a time that is a function of the depth of the digging that is to be obtained (with the upper limit determined by the rate of etching of the photoresist used for the mask 36 and by its thickness), also removed are surface portions of the drift layer 32 that are progressively exposed on account of removal of the progressively thinner portions of the mask 36. In other words, the mask 36 recedes in the direction of the axis X (away from the region 35) at the inclined surface in the transition zone 36a, progressively exposing portions of the top surface 32a of the drift layer 32, which may thus be etched and removed by the ion beam.

In this way, a transition region 32c of the drift layer 32 is obtained between the region 35 (active area of the diode 50) and the region 33 (edge termination region of the diode 50) that has a slope which is a function of the slope of the transition zone 36a of the mask 36 and of the difference between the etching rate of the material of the mask 36 and that of the material of the drift layer 32.

Thus, at the end of the step of FIG. 3C, the wafer 100 presents trenches 38 delimited by walls that have a slope comprised between 80° and 90° with respect to the top surface 32a (here, parallel to the plane XY of lie of the wafer 100) and a transition region 32c delimited by a surface of the drift layer 32 that has a slope comprised between 10° and 60° with respect to the top surface 32a. In a same processing step, two different slopes are thus obtained for two different functional regions of the diode 50 that is being produced.

Then (FIG. 3D), the mask 36 is removed, and the mask 34 kept on the wafer 100. A step is now carried out of implantation of dopant species (e.g., boron or aluminum), which have the second conductivity type (here, P), exploiting the hard mask 34 (indicated in the figure by arrows 39). A plurality of junction-barrier (JB) elements 40 are thus formed, here of a P type, at each trench 38.

Figure 3D:
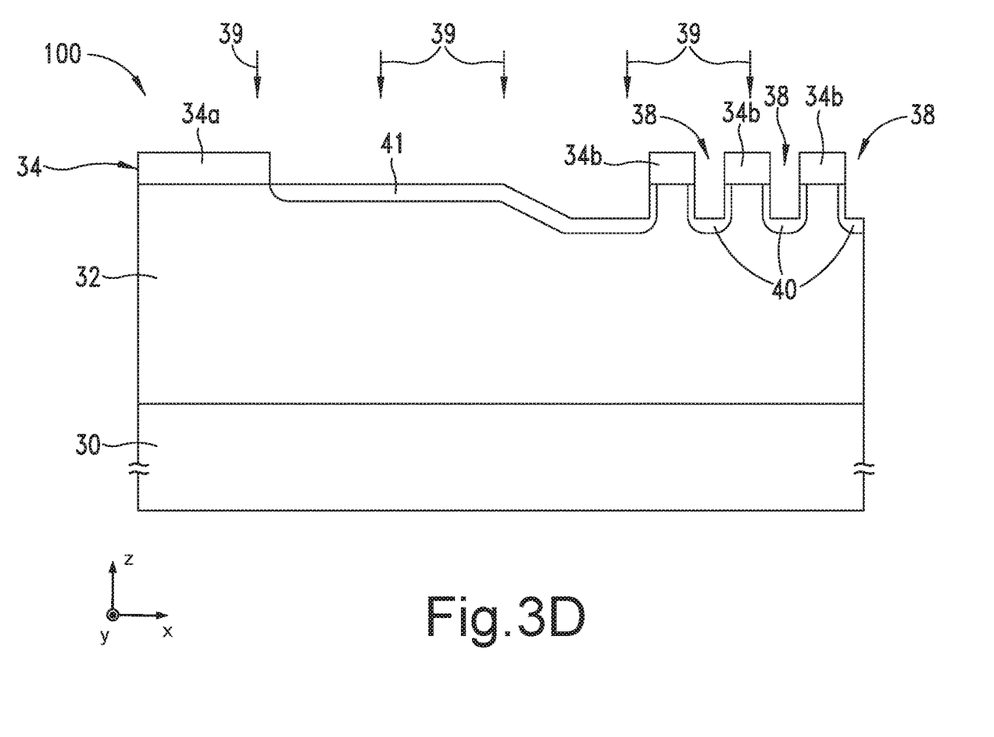

During the above implantation step, an implanted anode region 41 is likewise formed between the region 33 and the region 35 (i.e., between the mask portion 34a and the plurality of mask portions 34b).

In one embodiment, the step of FIG. 3D comprises one or more implantations of dopant species, which have the second type of conductivity, with implantation energy comprised between 30 keV and 400 keV, and with doses of between $1 \cdot 10^{12}$ atoms/cm$^2$ and $1 \cdot 10^{15}$ atoms/cm$^2$, in order to form the junction-barrier elements 40 and the implanted anode region 41, which have a dopant concentration higher than $1 \cdot 10^{18}$ atoms/cm$^3$.

This is then followed (FIG. 3E) by the step of formation of an edge region 42 by implantation of dopant species that have the second type of conductivity. For this purpose, before the implantation step, the mask 34 is removed and then an implantation mask 43 (e.g., of TEOS) is formed on the wafer 100, patterned so as to expose only the surface portions where it is desired to form the edge region 42. This is followed by implantation (here, of a P type and indicated in the figure by arrows 44), which is carried out by implanting dopant atoms (e.g., aluminum or boron) with an implantation energy comprised between 20 keV and 300 keV, and an implantation dose comprised between $1·10^{12}$ atoms/cm$^2$ and $1·10^{13}$ atoms/cm$^2$.

Figure 3E:
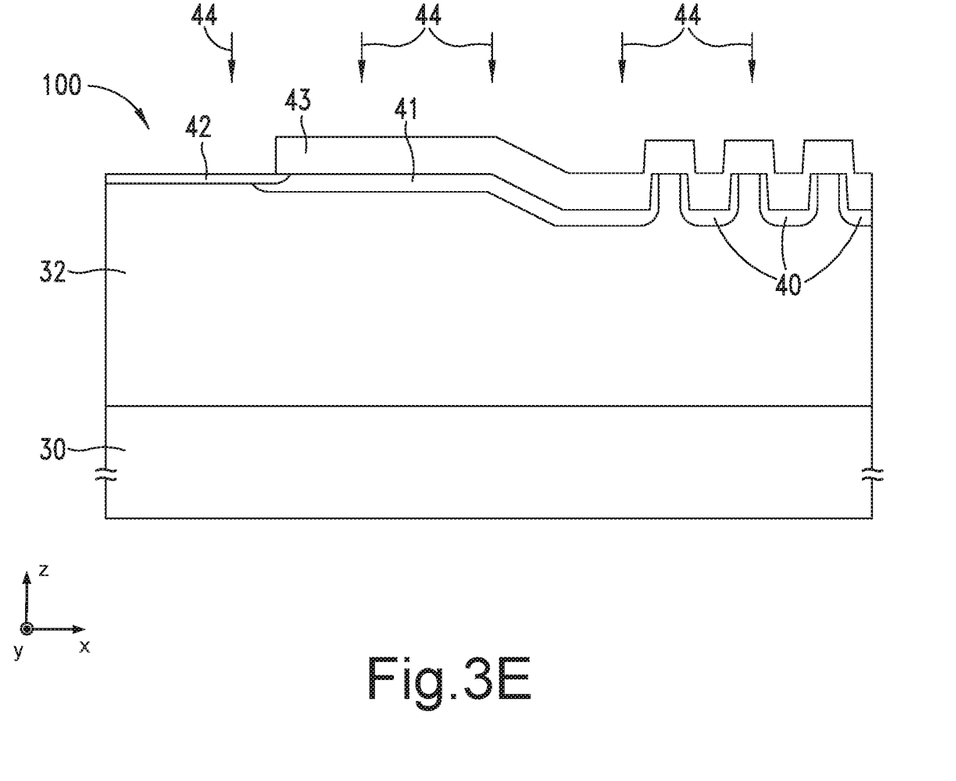
Figure 3F:
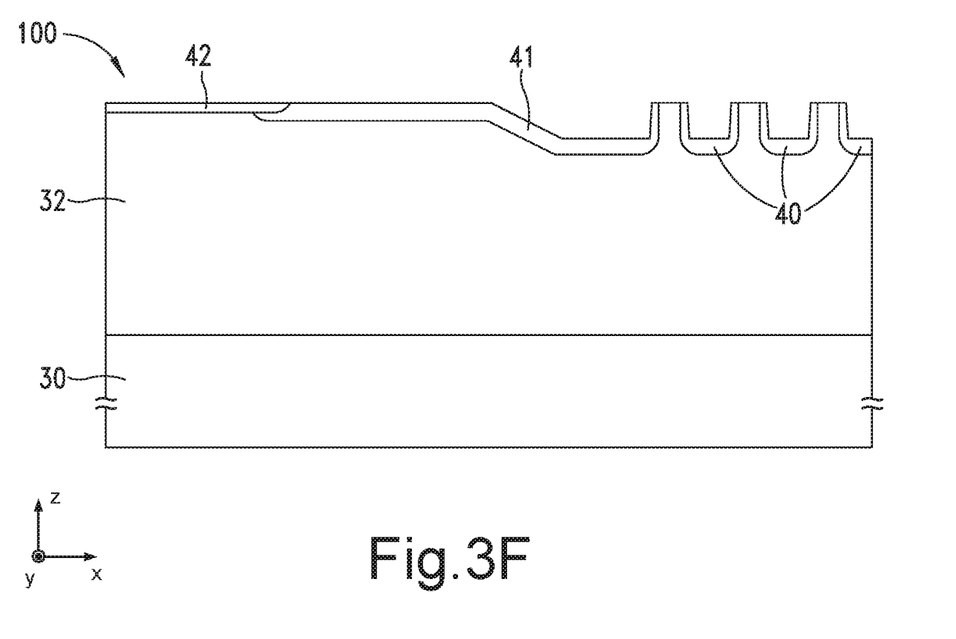

According to one embodiment, the mask 43 is patterned so that the edge region 42 extends partially overlapping a terminal portion of the implanted anode region 41, so that the two regions will be in electrical contact and the continuity of the layer of a P type will be guaranteed even in the presence of any possible misalignment between the masks 34 and 43.

Next (FIG. 3F), the mask 43 is removed and a step of thermal annealing is carried out for diffusion and activation of the dopant species implanted in the steps of FIGS. 3D and 3E. The thermal annealing is, for example, carried out at a temperature higher than 1600° C. (e.g., between 1700 and 1900° C., and in some cases even higher). Following upon thermal annealing, the edge region 42 has a concentration of dopant species comprised between approximately $1·10^{15}$ atoms/cm$^3$ and $1·10^{17}$ atoms/cm$^3$, whereas the junction-barrier elements 40 and the implanted anode region 41 have a concentration of dopant species comprised between approximately $1·10^{17}$ atoms/cm$^3$ and $1·10^{20}$ atoms/cm$^3$.

Figure 3G:
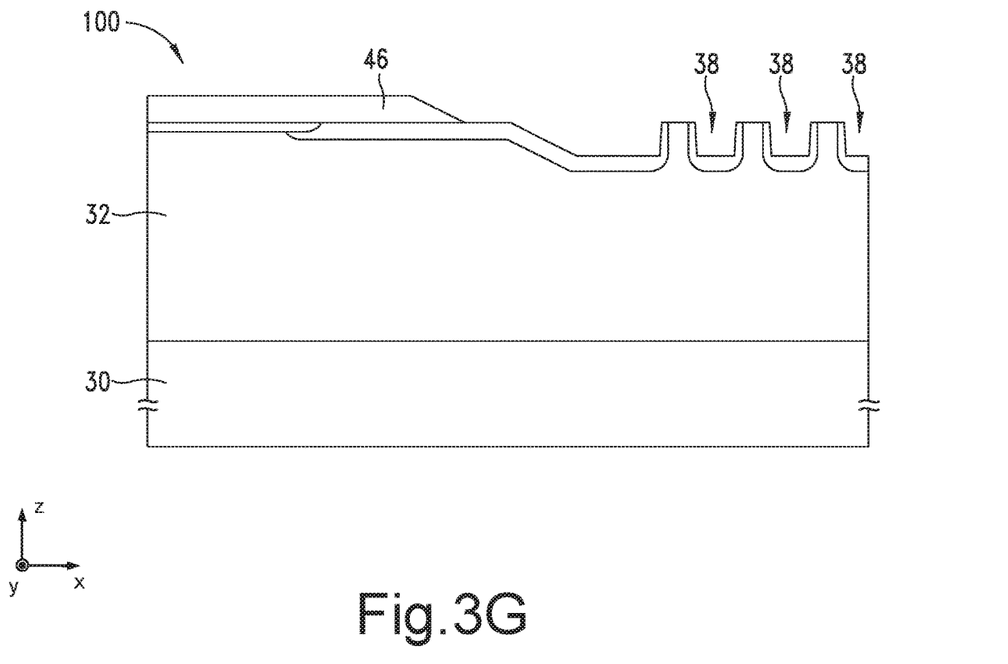

This is followed by formation of an insulating layer 46 is formed, designed to cover the edge region 42 completely and leave the transition zone 32 and the active-area region 35 exposed (FIG. 3G). The insulating layer 46 is, for example, of deposited TEOS.

Then (FIG. 3H), an anode metallization is formed.

Figure 3H:
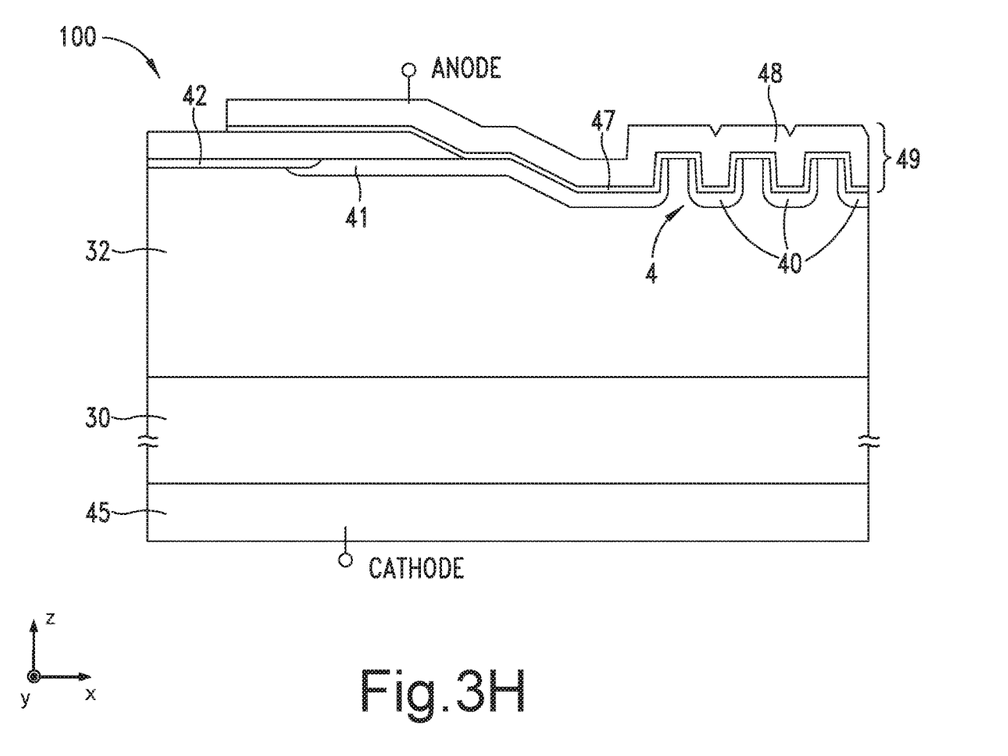

For this purpose, an interface layer 47, of metal material, such as titanium, nickel, molybdenum, or other conductive material chosen on the basis of physical parameters of the metal used for the interface layer 47 and of the semiconductor used for the drift layer 32, is deposited on the wafer 100 (in general, when the junction is provided between a metal and a semiconductor, an energy barrier is formed both for the electrons and for the holes). The aforesaid parameters include the work function of the metal, the work function of the semiconductor, and the electronic affinity of the semiconductor. The lower the work function of the metal, the lower the voltage drop; however, corresponding to metals with low work function are higher leakages in the finished device. Thus, the choice of the metal may be made on the basis of a compromise between the acceptable leakages and the acceptable voltage drop. The interface layer 47 is deposited via sputtering and has a thickness of between approximately 10 nm and 500 nm. The interface layer 47 extends in contact with the implanted anode region 41, with the regions of the drift layer 32 between one trench 38 and the adjacent one, and likewise penetrates into the trenches 38. In particular, the interface layer 47 forms a Schottky contact with the exposed regions of the drift layer 32 and forms an ohmic contact with the junction-barrier elements 40 and with the implanted anode region 41.

Next, a further metal layer 48 is formed on top of, and in direct contact with, the interface layer 47. The metal layer 48 is, for example, of aluminum or copper, and has a thickness of a few microns, for example between 1 and 10 μm.

The ensemble constituted by the interface layer 47 and the metal layer 48 forms an anode metallization 49.

A plurality of metal-semiconductor junctions of a Schottky type is thus formed between the anode metallization 49 and the regions of the drift layer 32 that have the first conductivity type(N).

An ohmic contact having the function of driving the PN junction is, instead, formed between the anode metallization 49 and the junction-barrier elements 40 (having the second type of conductivity, here P).

An ohmic contact having the function of driving the edge region is formed between the anode metallization 49 and the implanted anode region 41 (having the second type of conductivity, here P).

In a different embodiment (not illustrated), the interface layer 47 may be omitted, so that the anode metallization 49 coincides with the metal layer 48, which extends in direct contact with the drift layer 32.

Finally, a cathode contact is formed on the back side 30b of the substrate 30, for example by depositing a layer of metal material 45 designed to form an ohmic contact with the substrate 30.

The region of the drift layer 32 that extends along the axis Z between the Schottky junctions and the layer of metal material 45 (cathode) is the active area 4 of the diode 50 (i.e., the region where drift of the electrical charges occurs). The edge region 42 surrounds the active area 4 either completely (e.g., the edge region 42 is a ring) or partially. The function of the edge region 42 is to reduce or prevent crowding of the electrical-field lines on the outside of the Schottky junctions.

From an examination of the characteristics of the disclosure provided according to the present disclosure the advantages that it affords are evident.

In particular, the present disclosure enables formation, using a low-cost process in which the manufacturing steps are reduced in number as compared to processes of a known type, of trenches and diggings in a semiconductor device that have a different slope of the walls that delimit them. Even more in particular, these trenches and diggings are formed at the same time in a same processing step. This enables elimination of the problems of misalignment that could arise using different masks for formation of trenches and diggings delimited by walls that have slopes different from one another. Further, thanks to the technical solution of the present disclosure, the total area may be smaller as compared to the solution of FIG. 2, and at the same time undesirable concentrations of field lines at corners formed in the drift layer, as discussed with reference to the prior art of FIG. 1, are avoided.

Finally, it is clear that modifications and variations may be made to what has been described and illustrated herein, without thereby departing from the scope of the present disclosure.

For example, it is possible to implement the method described previously for manufacturing an electronic device having just one trench 38 and/or just one Schottky contact between the anode metallization 48 and the drift layer 32.

Further, it is possible to increase the slope of the region 32c beyond 50°, at the same time accepting a reduction in performance of the device, in any case maintaining the slope below the value of slope of the internal walls of the trenches 38. Likewise, it is possible to reduce the slope of the internal walls of the trenches 38 below 80°, in any case maintaining the slope above the value of slope of the region 32c.

The present disclosure may likewise be applied during the steps of production of an edge structure of devices of a trench-MOSFET type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure, comprising:
   a substrate;
   a drift layer on the substrate;
   a first trench in the drift layer, the first trench including a transition region and a side wall, the side wall having a first slope that is steeper than a second slope of the transition region; and
   an edge-termination structure on the drift layer;
   an anode metallization on the first trench.

2. The structure of claim 1 wherein the substrate is of a first conductivity and the drift layer is the first conductivity and the edge-termination structure is of a second conductivity type.

3. The structure of claim 1, comprising a cathode metallization on the substrate, the drift layer being spaced from the cathode metallization by the substrate.

4. A device, comprising:
   a substrate;
   a drift layer on the substrate;
   an anode region in the drift layer, the anode region having a sloped sidewall;
   a first and second junction barrier elements in the drift layer;
   an edge region in the drift layer;
   a first trench and a second trench, the first trench being between the sloped sidewall and the second trench; and
   an anode metallization on the first trench, the anode region, the sloped sidewall, and overlapping the edge region.

5. The device of claim 4 wherein the substrate is silicon carbide.

6. The device of claim 4 wherein the edge region overlaps the anode region.

7. The device of claim 4 including a conductive layer on the anode region and on the first and second junction barrier elements.

8. The device of claim 7, comprising an anode metallization on the sloped sidewall and in the first and second trenches.

9. The device of claim 8, comprising an insulating layer on the edge region and on a portion of the anode region.

10. The device of claim 9 wherein the insulating layer is between the portion of the anode region and the anode metallization.

11. A device, comprising:
    a doped layer;
    an edge region in the doped layer;
    a first and second trench in the doped layer;
    a sloped sidewall of the doped layer between the edge region and the first trench; and
    an anode metallization on the edge region, the sloped sidewall, and in the first and second trench.

12. The device of claim 11 wherein the doped layer is a first conductivity type and the edge region is a second conductivity type.

13. The device of claim 12, comprising an anode region in the doped layer, the anode region extending from the edge region to the first trench and including the sloped sidewall.

14. The device of claim 13, comprising a first doped region between the first and second trench.

15. The device of claim 14 wherein the first doped region is second conductivity type.

16. The device of claim 15 wherein the anode metallization is on the anode region.

17. The device of claim 16, comprising an insulating layer on the edge region and on a portion of the anode region, the insulating layer being between the portion of the anode region and the anode metallization.

18. The device of claim 17 wherein the edge region overlaps the anode region.

* * * * *